United States Patent

Hong

US005770501A

[11] Patent Number: 5,770,501
[45] Date of Patent: Jun. 23, 1998

[54] PROCESS OF FABRICATING NAND-STRUCTURE FLASH EEPROM USING LIQUID PHASE DEPOSITION

[75] Inventor: Gary Hong, Hsinchu, Taiwan

[73] Assignee: United Microelectronics Corporation, Hsinchu, Taiwan

[21] Appl. No.: 577,033

[22] Filed: Dec. 22, 1995

[51] Int. Cl.$^6$ ................................................. H01L 21/8247
[52] U.S. Cl. ........................... 438/264; 438/296; 438/424
[58] Field of Search ............................... 437/43, 67, 984; 148/DIG. 50; 438/263, 264, 296, 424

[56] References Cited

U.S. PATENT DOCUMENTS

| | | | |
|---|---|---|---|
| 5,173,436 | 12/1992 | Gill et al. ................................ | 437/43 |
| 5,256,593 | 10/1993 | Iwai ........................................... | 437/67 |
| 5,516,721 | 5/1996 | Galli et al. .............................. | 437/67 |
| 5,559,048 | 9/1996 | Inoue ....................................... | 437/43 |

Primary Examiner—Chandra Chaudhari
Attorney, Agent, or Firm—Townsend and Townsend and Crew LLP

[57] ABSTRACT

A process of fabricating a flash EEPROM having a NAND structure by using the liquid phase deposition (LPD) technique and self-alignment technique is disclosed to achieve higher density and reliability of flash memory cells and eliminating the shortcomings of the bird's beaks of field oxides.

16 Claims, 6 Drawing Sheets

PROCESS OF FABRICATING NAND-STRUCTURE FLASH EEPROM USING LIQUID PHASE DEPOSITION

FIELD OF THE INVENTION

The present invention relates to a process of fabricating a flash electrically erasable programmable read only memory (flash EEPROM) having a NAND structure, especially to a process of forming a NAND-structure flash EEPROM by using self-alignment technique to achieve higher density and reliability.

BACKGROUND OF THE INVENTION

Referring to FIGS. 1, 2 and 3, FIG. 1 shows the top view of a conventional flash EEPROM having a NAND structure, FIG. 2 is a cross-sectional view of the conventional flash EEPROM taken along line II—II in FIG. 1, and FIG. 3 is a cross-sectional view of the conventional flash EEPROM taken along line III—III in FIG. 1. The conventional flash EEPROM includes a P-type semiconductor substrate 1, field oxides 10, tunnel oxides 20, floating gates 22, a gate dielectric layer 24, control gates (or word lines) 26, source/drain regions 28.

As shown in FIGS. 1 and 3, the conventional flash EEPROM is constructed by serially connected flash memory cell series, and adjoining series must be isolated properly. As shown in FIGS. 1 and 2, the flash memory cell series of the conventional flash EEPROM are isolated by field oxides 10. When forming field oxides 10, the field oxides 10 will horizontally expand into the semiconductor substrate 1 and then form bird's beaks which occupy the area of the substrate 1; therefore the density of the flash EEPROM is limited. Furthermore, the bird's beaks will induce crystal lattice defects, causing current leakage.

SUMMARY OF THE INVENTION

It is therefore an object for the present invention to eliminate the shortcomings of the bird's beaks in the flash EEPROM by using the liquid phase deposition (LPD) technique.

Another object of the present invention is to provide a process for fabricating a flash EEPROM having the advantage of self-alignment.

The LPD technique can be illustrated by an example. FIG. 4 shows a schematic drawing of an LPD system which can be used to carry out the LPD of $SiO_2$ films. The LPD system is equipped with a reactive vessel 32, a water bath 35, an automatically controlled dripper 34 for boric acid ($H_3BO_3$) aqueous solution, a magnetic stirrer 33, and a heater 36. A carrier 30 holding wafers 31 therein is put into the reactive vessel 32. In the reactive vessel 32, a saturated hydrofluosilicic acid ($H_2SiF_6$) aqueous solution is used as the base solution. The reactive vessel 32 is warmed inside the water bath 35 which is maintained at a temperature of about 35° C. by the heater 36. To maintain the saturated $H_2SiF_6$ solution in the reactive vessel 32, $H_3BO_3$ aqueous solution is added continuously in the saturated $H_2SiF_6$ solution from the dripper 34 during the $SiO_2$ film deposition. The saturated $H_2SiF_6$ solution is stirred by the magnetic stirrer 33 to diffuse the $H_3BO_3$ solution. The reaction can be explained by the following chemical formulas:

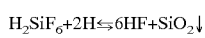

The LPD technology has an extremely excellent deposition selectivity, and can be applied for selective deposition on silicon dioxide and polysilicon while not on other materials, such as photoresist, tungsten, or the like.

The object of the present invention is fulfilled by providing a process of fabricating a NAND-structure flash EEPROM on a semiconductor substrate of a first conductivity type. The fabricating process comprises the following steps of: (a) forming a tunnel dielectric layer on the substrate; (b) forming a first conductive layer on said tunnel dielectric layer; (c) forming a plurality of mask lines along a first direction on said first conductive layer; (d) etching the first conductive layer, tunnel dielectric layer and substrate by using said mask lines as a mask to form a plurality of trenches, said remaining first conductive layer forming a plurality of conductive lines; (e) depositing isolating dielectrics in said trenches by liquid phase deposition, using said mask lines as a mask; (f) removing said mask lines; (g) forming a gate dielectric layer on said isolating dielectrics and said conductive lines; (h) forming a second conductive layer on said gate dielectric layer; (i) etching said second conductive layer, gate dielectric layer and conductive lines along a second direction having a predetermined angle with said first direction, said remaining second conductive layer forming a plurality of control gates, said remaining conductive lines forming floating gates; and (j) implanting impurities of a second conductivity type into the substrate by using said control/floating gates as a mask to form source/drain regions.

DETAILED DESCRIPTION OF THE PREFERRED EMBODIMENTS

Figure 1:
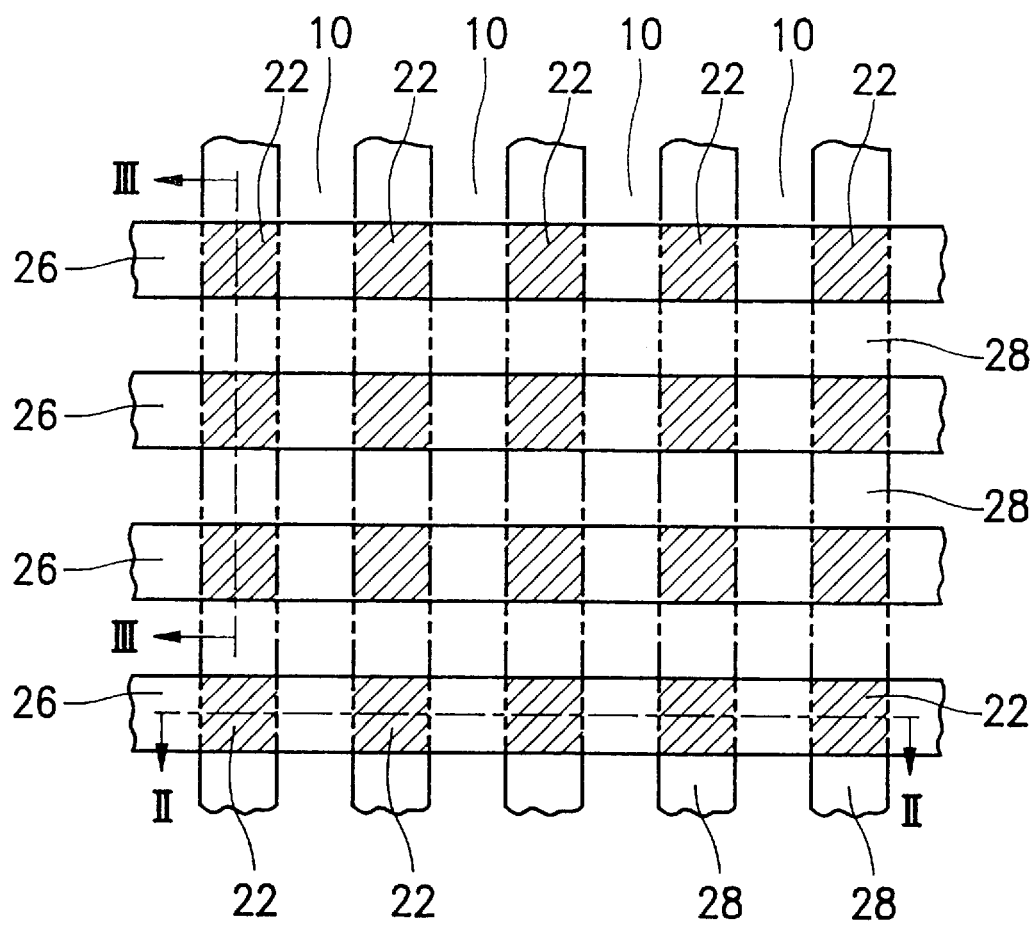
FIG. 1 shows a top view of the conventional flash EEPROM having a NAND structure.
Figure 2:
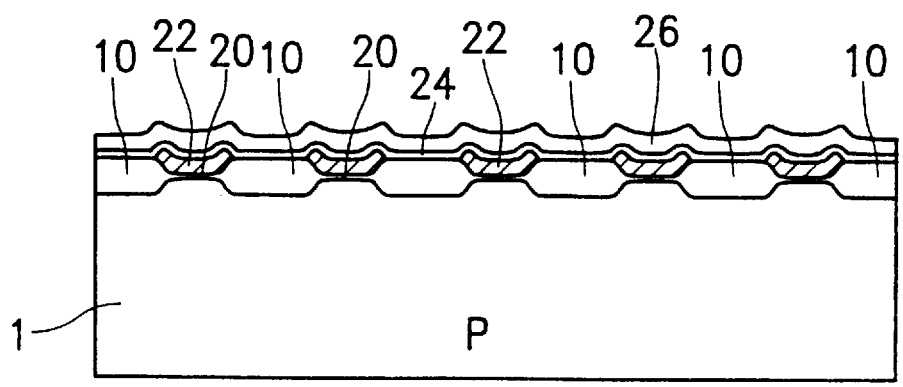
FIG. 2 is a cross-sectional view of the conventional flash EEPROM taken along line II—II in FIG. 1.
Figure 3:
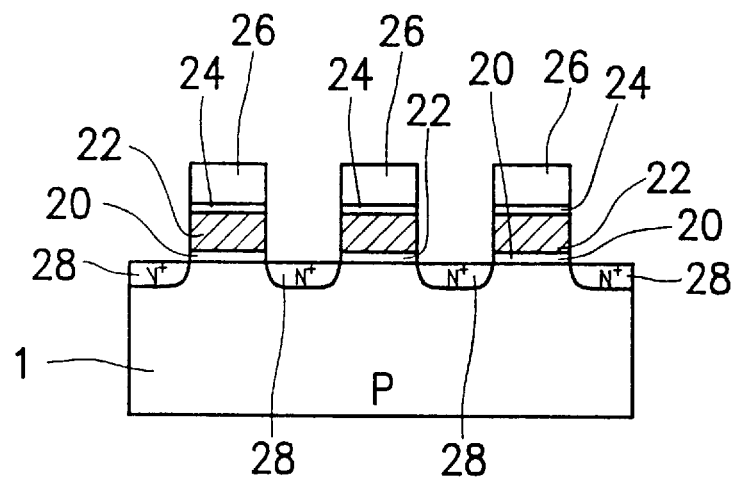
FIG. 3 is a cross-sectional view of the conventional flash EEPROM taken along line III—III in FIG. 1.
Figure 4:
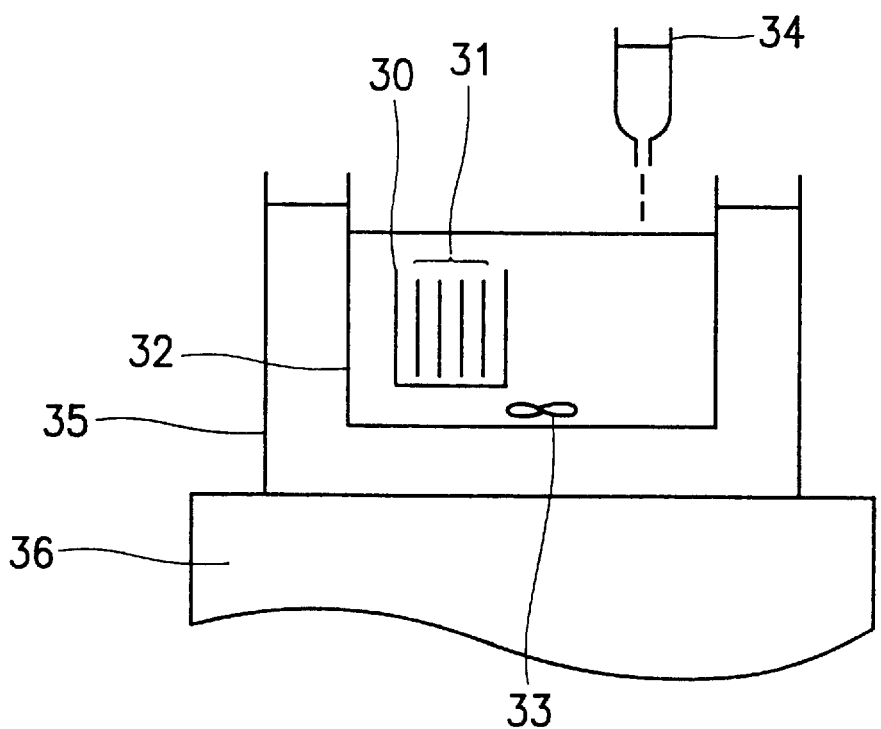
FIG. 4 is an illustrative diagram of the LPD system.
Figure 5:
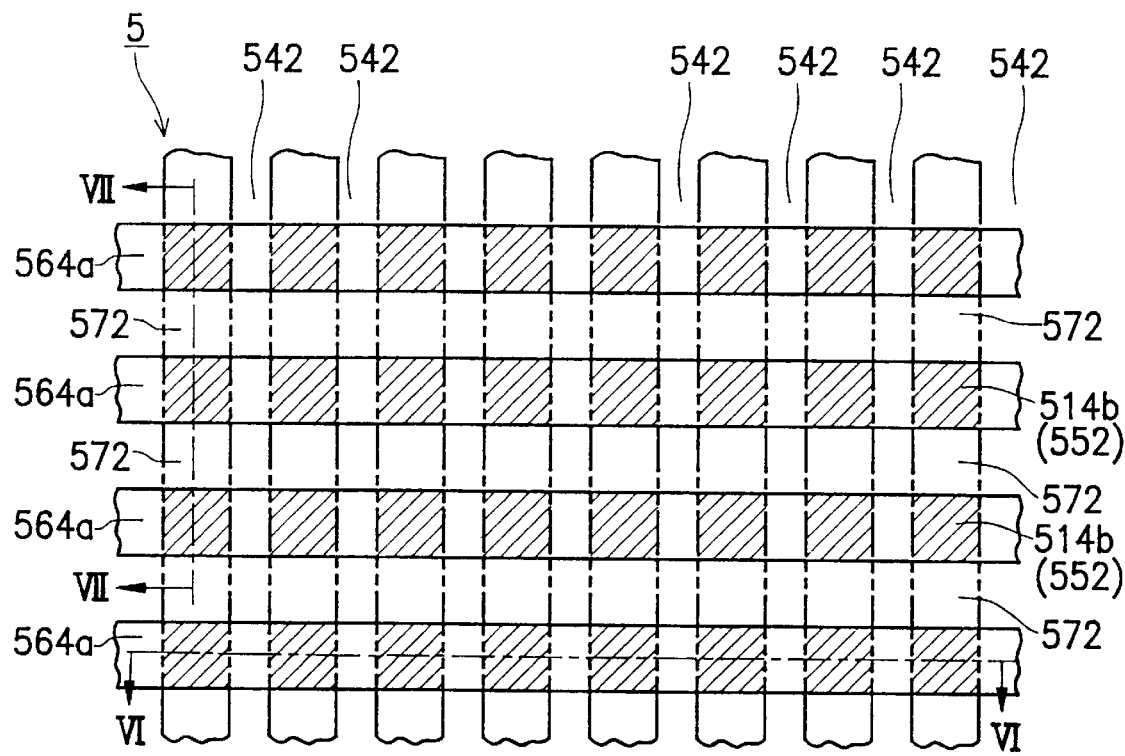
FIG. 5 shows a top view of a NAND-structure flash EEPROM according to one preferred embodiment of the present invention.
Figure 6A:
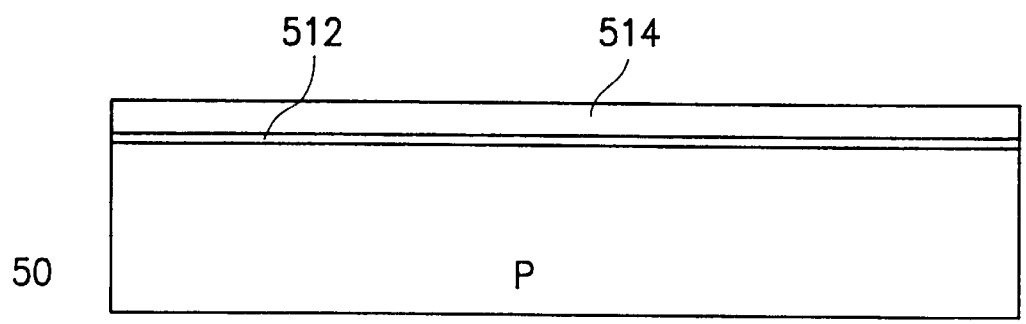
FIGS. 6a to 6f are the cross-sectional views of the flash EEPROM throughout various processing steps according to the present invention, taken along line VI—VI in FIG. 5.
Figure 6B:
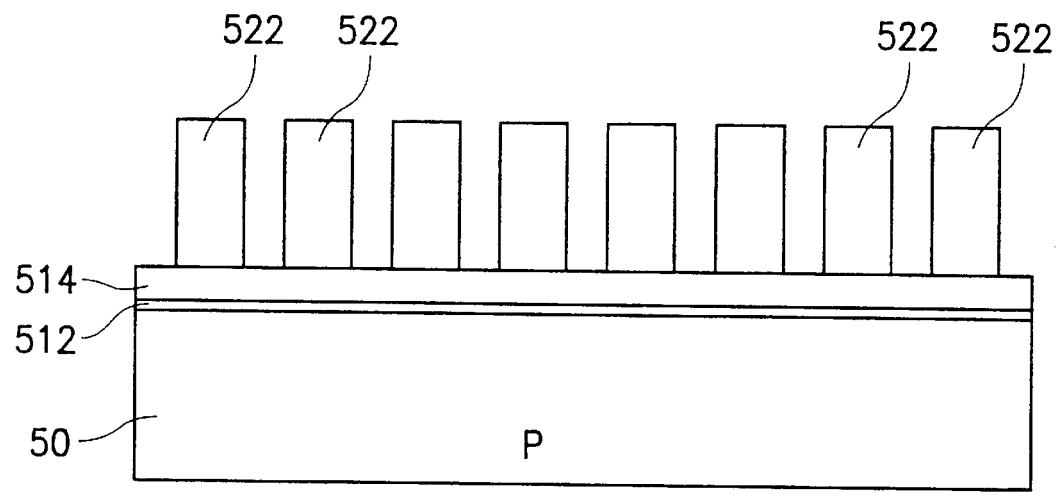
Figure 6C:
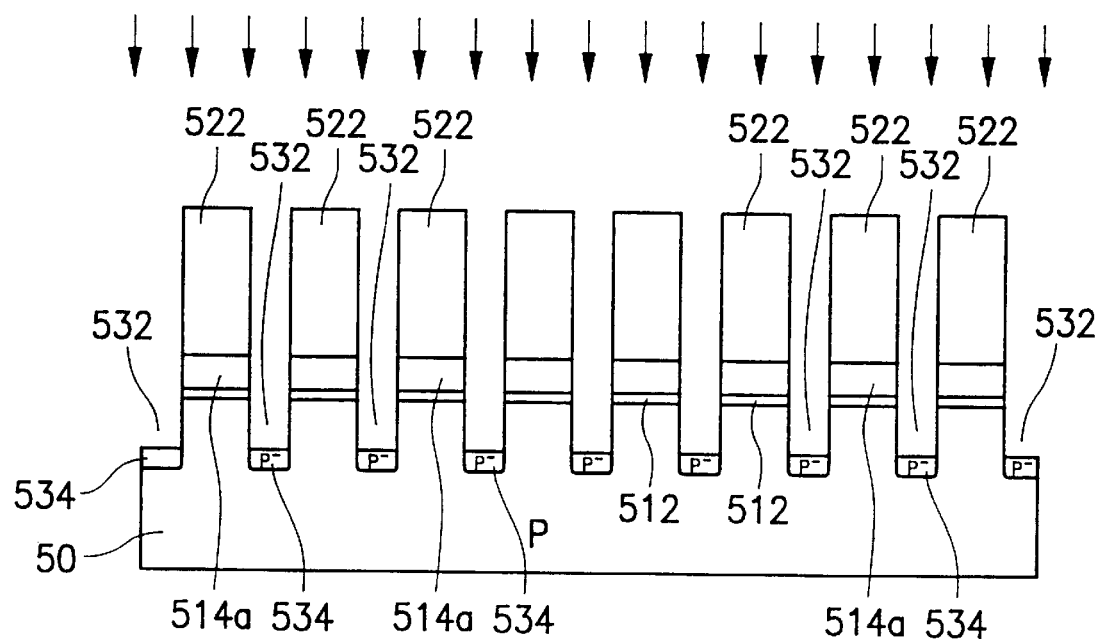
Figure 6D:
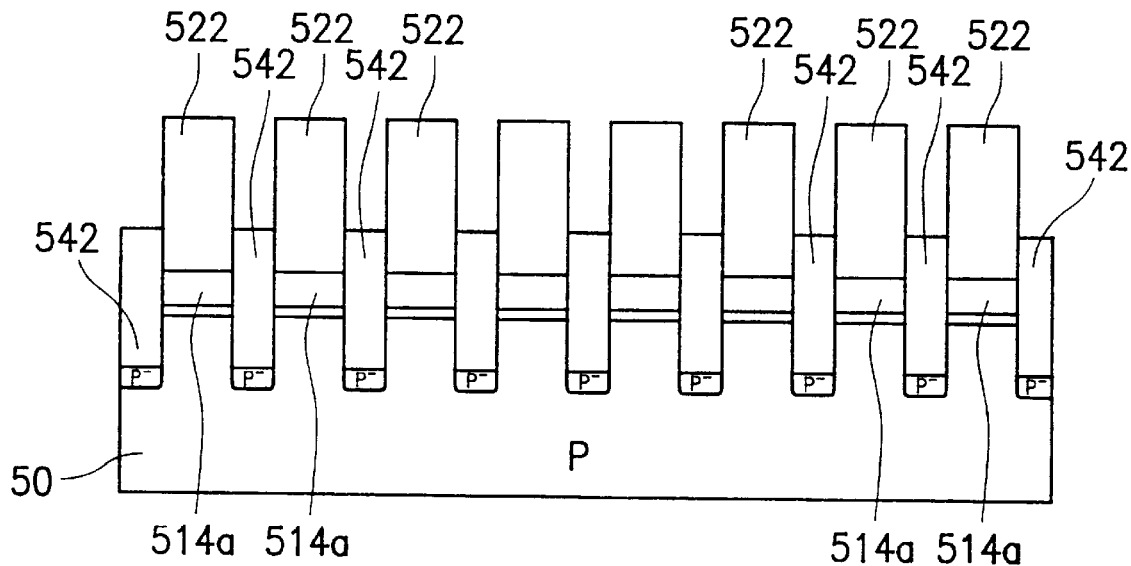
Figure 6E:
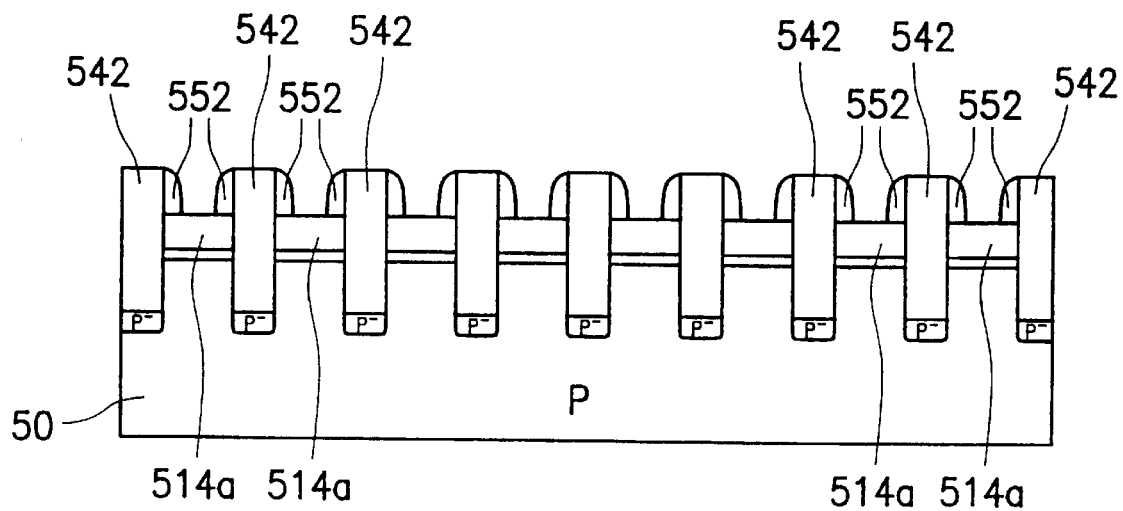
Figure 6F:
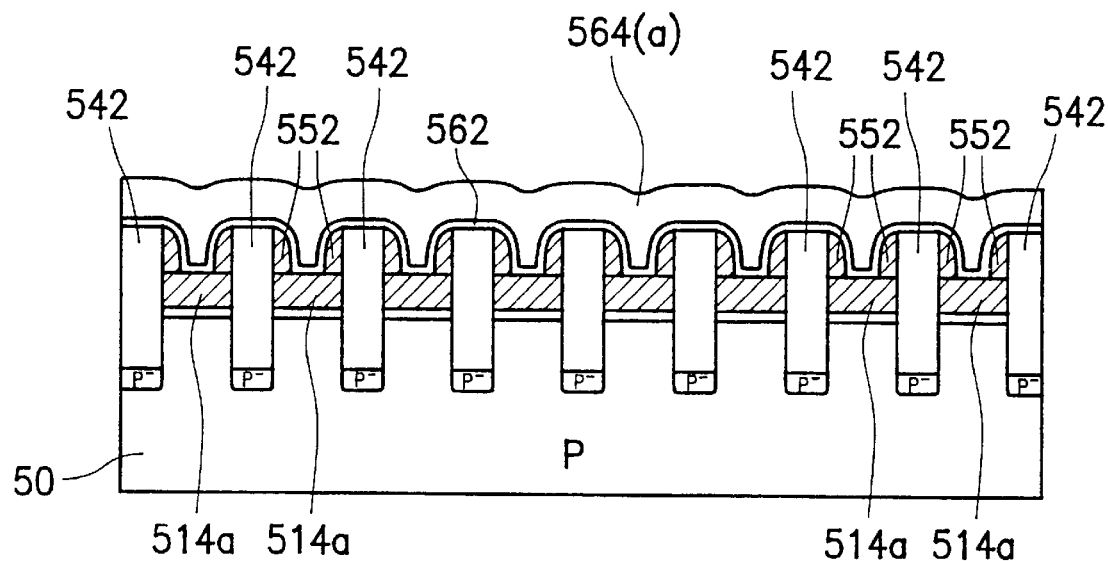
Figure 7:
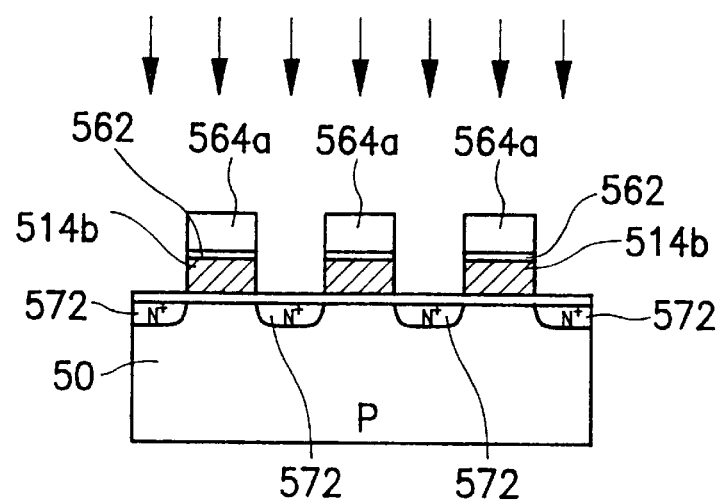
FIG. 7 is a cross-sectional view of the flash EEPROM of the present invention, taken along line VII—VII in FIG. 5.

An embodiment of the present invention is applied to a semiconductor substrate 50 of P type to fabricate a NAND-structure flash EEPROM according to the present invention as illustrated in FIGS. 5 to 7 and described hereinafter.

STEP 1

Referring to FIG. 6a, a tunnel dielectric layer 512 is formed on the substrate 50. After that, a first conductive layer 514 is formed thereon.

This step may be done by, for example, first thermally oxidizing the substrate 50 to form a tunnel oxide layer 512 to a thickness of 50 to 100 angstroms, and then by depositing a polysilicon layer 514 to a thickness of 500 to 4000 angstroms. Then impurities are implanted into the polysilicon layer 514 to reduce its resistance.

STEP 2

Referring to FIG. 6b, a plurality of mask lines 522 are formed on the first conductive layer 514 along a first direction.

This may be done by, for example, depositing a photoresist layer, then by etching the photoresist layer to leave the photoresist lines 522 using a photolithography technique.

STEP 3

As shown in FIG. 6c, the first conductive layer 514, tunnel dielectric layer 512 and substrate 50 are etched sequentially by using the mask lines 522 as mask to form a plurality of trenches 532. The remaining first conductive layer 514 then forms a plurality of conductive lines 514a.

For example, this step could be done by dry etching to form the trenches 532. The trenches 532 should at least reach the tunnel oxide layer 512. However, the trenches 532 are preferably deep in the substrate 50, and P type impurities may be implanted into the trenches 532 to form P$^-$ type isolation regions 534, to achieve better isolation. The P type impurities may be boron, with a dosage of about $1 \times 10^{13}$ atoms/cm$^2$ and a kinetic energy of about 30 KeV.

STEP 4

As shown in FIG. 6d, also using the mask lines 522 as a mask, isolating dielectrics 542 are deposited in the trenches 532 between the mask lines 522 by the liquid phase deposition technique. The mask lines 522 are then removed.

This step may be done by using the liquid phase deposition technique described hereinbefore to deposit oxides 542 in the trenches 532. In this step, the oxides 542 are self-aligned. The upper surfaces of the oxides 542 may be higher than the upper surfaces of the conductive lines 514a. The mask lines 522 may be removed by etching. After the mask lines 522 are removed, the side walls of the oxides 542 will be exposed. Then, sidewall spacers 552 may be formed on the side walls of the oxides 542, as shown in FIG. 6e, to increase the coupling ratio of the flash memory cells. The formation of the sidewall spacers 552, may be accomplished by first depositing a polysilicon layer and doping impurities therein to reduce its resistance, and then etching back to form the conductive sidewall spacers 552.

STEP 5

As shown in FIG. 6f, a gate dielectric layer 562 is formed thereon by, for example, depositing an oxide-nitride-oxide (ONO) layer 562. A second conductive layer 564 is then formed by, for example, depositing a polysilicon layer and doping impurities therein to reduce its resistance. After that, the second conductive layer 564, the gate dielectric layer 562, the conductive sidewall spacer 552 and the conductive lines 514a are etched along a second direction having a predetermined angle with the first direction by using conventional photolithography and etching techniques. In this embodiment, the second direction is orthogonal with the first direction. Therefore, the remaining second conductive layer 564 then forms a plurality of control gates (or word lines) 564a, and the remaining conductive lines 514a form floating gates 514b.

STEP 6

As shown in FIG. 7, the substrate 50 is implanted with impurities of the second conductivity type by using the stacked control/floating gates 564a/514B as the mask, to form source/drain regions 572. The source/drain regions 572 could be N$^+$ type. The impurities of the second conductivity type may be arsenic ions, and may be implanted with a dosage of about $2 \times 10^{15}$ atoms/cm$^2$ and a kinetic energy of about 50 KeV.

It should be noted that the present invention may be applied to either a P-type substrate or an N-type substrate. Since the interchange of P-type and N-type substrates is well known to those skilled in the art, it is not further discussed hereinafter.

As stated above, the present invention utilizes the liquid phase deposition technique to deposit isolating dielectrics instead of field oxides, therefore eliminating the shortcomings of the bird's beaks in the flash EEPROM. Furthermore, since the present invention uses a self-aligned process, the density of the flash memory cells is increased. The reliability of the flash EEPROM will therefore be improved.

While the invention has been described by way of examples and in terms of several preferred embodiments, it is to be understood that the invention need not be limited to the disclosed embodiment. On the contrary, it is intended to cover various modifications and similar arrangements included within the spirit and scope of the appended claims, the scope of which should be accorded the broadest interpretation so as to encompass all such modifications and similar structures.

What is claimed is:

1. A process of fabricating a flash EEPROM on a semiconductor substrate of a first conductivity type, comprising the following steps of:

(a) forming a tunnel dielectric layer on the substrate;

(b) forming a first conductive layer on said tunnel dielectric layer;

(c) forming a plurality of mask lines on said first conductive layer;

(d) etching to form a plurality of trenches by using said mask lines as a mask, said first conductive layer being etched to form a plurality of conductive lines;

(e) using said mask lines as a mask to deposit isolating dielectrics in said trenches by liquid phase deposition;

(f) removing said mask lines;

(g) forming a gate dielectric layer on said isolating dielectrics and said conductive lines;

(h) forming a second conductive layer on said gate dielectric layer;

(i) patterning said second conductive layer, gate dielectric layer and conductive lines so that said remaining second conductive layer forms a plurality of control gates, and said remaining conductive lines form floating gates; and (j) implanting impurities of a second conductivity type into the substrate by using said control/floating gates as a mask to form source/drain regions.

2. The fabricating process as claimed in claim 1, wherein said trenches are deep in the substrate.

3. The fabricating process as claimed in claim 1, wherein the upper surfaces of said isolating dielectrics are higher than the upper surfaces of said conductive lines, and wherein said step (f) further comprises the step of forming conductive sidewall spacers on the side walls of said isolating dielectrics.

4. The fabricating process as claimed in claim 3, wherein said step (d) further comprises the step of implanting impurities of a second conductivity type to form isolation diffusion regions in the bottoms of said trenches.

5. The fabricating process as claimed in claim 4, wherein said isolating dielectrics and said tunnel dielectric layer are oxide.

6. The fabricating process as claimed in claim 5, wherein said gate dielectric layer has an oxide-nitride-oxide structure.

7. The fabricating process as claimed in claim 6, wherein said first conductive layer, said second conductive layer and said conductive sidewall spacers are made from polysilicon.

8. The fabricating process as claimed in claim 7, wherein said first conductivity type is P-type and said second conductivity type is N-type.

9. The fabricating process as claimed in claim 7, wherein said first conductivity type is N-type and said second conductivity type is P-type.

10. The fabricating process as claimed in claim 2, wherein the upper surfaces of said isolating dielectrics are higher than the upper surfaces of said conductive lines, and wherein said step (f) further comprises the step of forming conductive sidewall spacers on the side walls of said isolating dielectrics.

11. The fabricating process as claimed in claim 10, wherein said step (d) further comprises the step of implanting impurities of a second conductivity type to form isolation diffusion regions in the bottoms of said trenches.

12. The fabricating process as claimed in claim 11, wherein said isolating dielectrics and said tunnel dielectric layer are oxide.

13. The fabricating process as claimed in claim 12, wherein said gate dielectric layer has an oxide-nitride-oxide structure.

14. The fabricating process as claimed in claim 13, wherein said first conductive layer, said second conductive layer and said conductive sidewall spacers are made from polysilicon.

15. The fabricating process as claimed in claim 14, wherein said first conductivity type is P-type and said second conductivity type is N-type.

16. The fabricating process as claimed in claim 14, wherein said first conductivity type is N-type and said second conductivity type is P-type.

* * * * *